United States Patent [19]
Zinn et al.

[11] Patent Number: 5,710,538
[45] Date of Patent: Jan. 20, 1998

[54] CIRCUIT HAVING TRIM PADS FORMED IN SCRIBE CHANNEL

[75] Inventors: Raymond D. Zinn, Atherton; Lawrence R. Sample; Michael J. Mottola, both of San Jose, all of Calif.

[73] Assignee: Micrel, Inc., San Jose, Calif.

[21] Appl. No.: 535,303

[22] Filed: Sep. 27, 1995

[51] Int. Cl.⁶ .................................................. H01L 10/00
[52] U.S. Cl. ........................ 338/195; 338/320; 338/203; 338/325; 29/610.1
[58] Field of Search ........................ 338/203, 295, 338/320, 325, 48, 319, 260, 195; 29/610.1, 412, 413, 847, 835, 836

[56] References Cited

U.S. PATENT DOCUMENTS

| | | | |
|---|---|---|---|
| 2,693,023 | 11/1954 | Kerridge et al. | 338/195 |
| 3,930,304 | 1/1976 | Keller et al. | 437/8 |
| 3,983,528 | 9/1976 | King | 338/195 |
| 4,150,366 | 4/1979 | Price | 341/121 |
| 4,199,745 | 4/1980 | Barry | 338/320 |
| 4,201,970 | 5/1980 | Onyshkevych | 338/195 |
| 4,228,418 | 10/1980 | Piedmont et al. | 338/195 |
| 4,378,549 | 3/1983 | Szware | 338/195 |
| 4,486,738 | 12/1984 | Sadlo et al. | 427/96 |
| 4,610,079 | 9/1986 | Abe et al. | 29/583 |
| 5,015,989 | 5/1991 | Wohlfarth | 338/195 |
| 5,059,899 | 10/1991 | Farnworth | 324/158 R |
| 5,493,148 | 2/1996 | Ohata et al. | 338/195 |

FOREIGN PATENT DOCUMENTS

| | | |
|---|---|---|
| 0 361 439 | 4/1990 | European Pat. Off. . |
| 0 450 648 | 10/1991 | European Pat. Off. . |
| 62-106638 | 5/1987 | Japan . |
| 02 184043 | 7/1990 | Japan . |
| 02 211648 | 8/1990 | Japan . |
| 02 266558 | 10/1990 | Japan . |
| 05 299484 | 11/1993 | Japan . |

OTHER PUBLICATIONS

Nickel, D.J., "Element Trimming Fusible Lind" IBM Technical Disclosure Bulletin, V.26, No. 8, 1984.

Primary Examiner—Teresa J. Walberg
Assistant Examiner—Karl Easthom
Attorney, Agent, or Firm—Skjerven, Morrill, MacPherson, Franklin & Friel; Brian D. Ogonowsky

[57] ABSTRACT

In accordance with the present invention, trim pads used in trimming on-chip resistive elements are formed in the scribe channels interposed between respective dice on a wafer. Metal traces connect the trim pads to their associated resistive elements formed on the dice. Thus, each trim pad formed within the scribe channels results in a corresponding increase in the usable silicon surface area of the dice, thereby saving valuable silicon real estate.

4 Claims, 2 Drawing Sheets

CIRCUIT HAVING TRIM PADS FORMED IN SCRIBE CHANNEL

FIELD OF THE INVENTION

The present invention relates to trim pads used for testing integrated circuits and adjusting the characteristics of components formed thereon.

BACKGROUND

Many integrated circuits (ICs) such as voltage regulators and analog to digital converters (ADCs) require precise resistance values for the resistors fabricated thereon in order to meet desired circuit specifications. However, since process variations inherent during the fabrication of ICs may result in the actual resistance of an on-chip resistive element varying as much as 15–20% from its intended value, it is necessary to "trim" such resistive elements after fabrication to the desired resistance value.

One well known trimming technique employs resistive elements having fusible metal links, as described in U.S. Pat. No. 5,015,989, issued May 14, 1991 to Wohlfarth et al, herein incorporated by reference, and shown in FIG. 1. A wafer 10 has formed thereon a plurality of dice 11. Scribe channels 12 provide spacing between dice 11 for subsequent saw cuts used in physically separating completed dice 11 from one another. Alignment targets (not shown) used in aligning various masks to dice 11 are typically formed in scribe channels 12. Dice 11 are shown to include a plurality of fusible links 14a–14c connected in shunt with respective resistive elements 15a–15c and interposed between an associated pair of trim pads 16a–16d. The total resistance of resistance elements 15a–15c may be adjusted by applying a voltage between selected pairs of trim pads 16a–16d. The resultant current flow through selected ones of links 14a–14c "blow" these links 14a–14c, thereby open circuiting selected portions of resistive elements 15a–15c. For instance, where it is desired to "unshort" resistive element 15a, a sufficient voltage is applied between trim pads 16a and 16b so as to blow fusible link 14a.

Trim pads 16a–16d are typically formed on the periphery of each of dice 11 and must be sufficiently large so that probes may be used to apply a voltage across selected pairs of trim pads 16a–16d. Typically requiring a surface area of 0.004 square inches or more, trim pads 16a–16d consume an undesirably large amount of silicon surface area. The periphery of chips requiring a significant number of trimmable resistive elements may become dominated by such trim pads, thereby undesirably increasing the size of the chip and wasting valuable silicon real estate.

Some have addressed this wasting of silicon area by altogether eliminating the trim pads. For instance, in laser trimming techniques, a laser beam is used to alter the shape, and thus the resistance, of on-chip resistive elements by cutting the resistive elements along predetermined cut paths. However, the aging and annealing effects resulting from laser ablation may degrade the performance of the resistive element's host circuit. The partially "zapped" material around the edge of the laser-ablated cut path will often have properties different from those of the undisturbed material further away from the laser-ablated regions. Further, the resistance of the partially zapped material will age at a different rate than will the remaining portions of the resistive element. As a result, the IC may drift out of specification after prolonged usage.

SUMMARY

In accordance with the present invention, trim pads used in trimming on-chip resistive elements are formed in the scribe channels interposed between respective dice on a wafer. Metal traces connect the trim pads to their associated resistive elements formed on the dice. Thus, each trim pad formed within the scribe channels results in a corresponding increase in the usable silicon surface area of the dice, thereby saving valuable silicon real estate.

DETAILED DESCRIPTION

Figure 1:
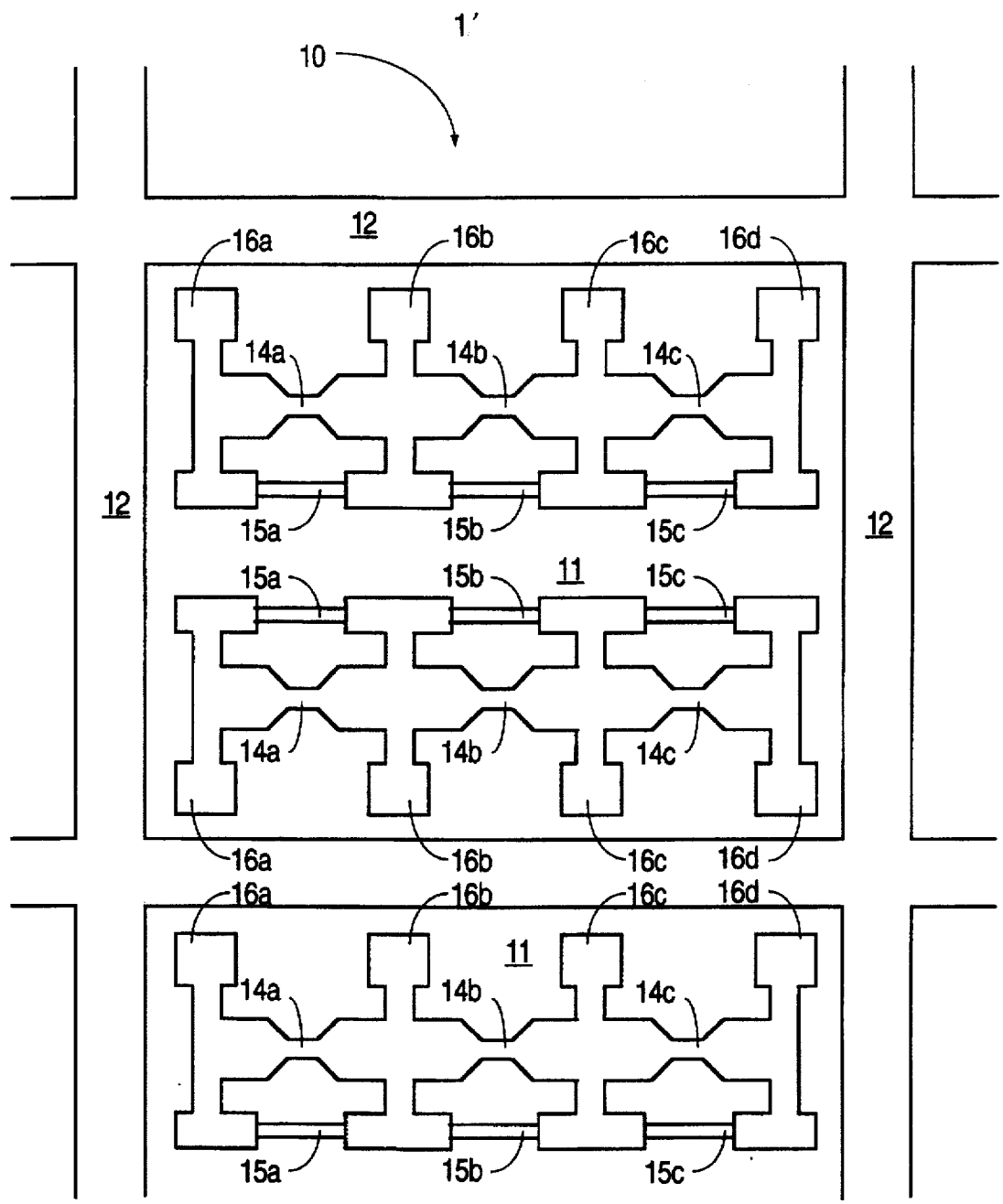
FIG. 1 shows dice having fusible links shunting associated resistive elements and having trim pads associated therewith configured in a conventional manner.
Figure 2:
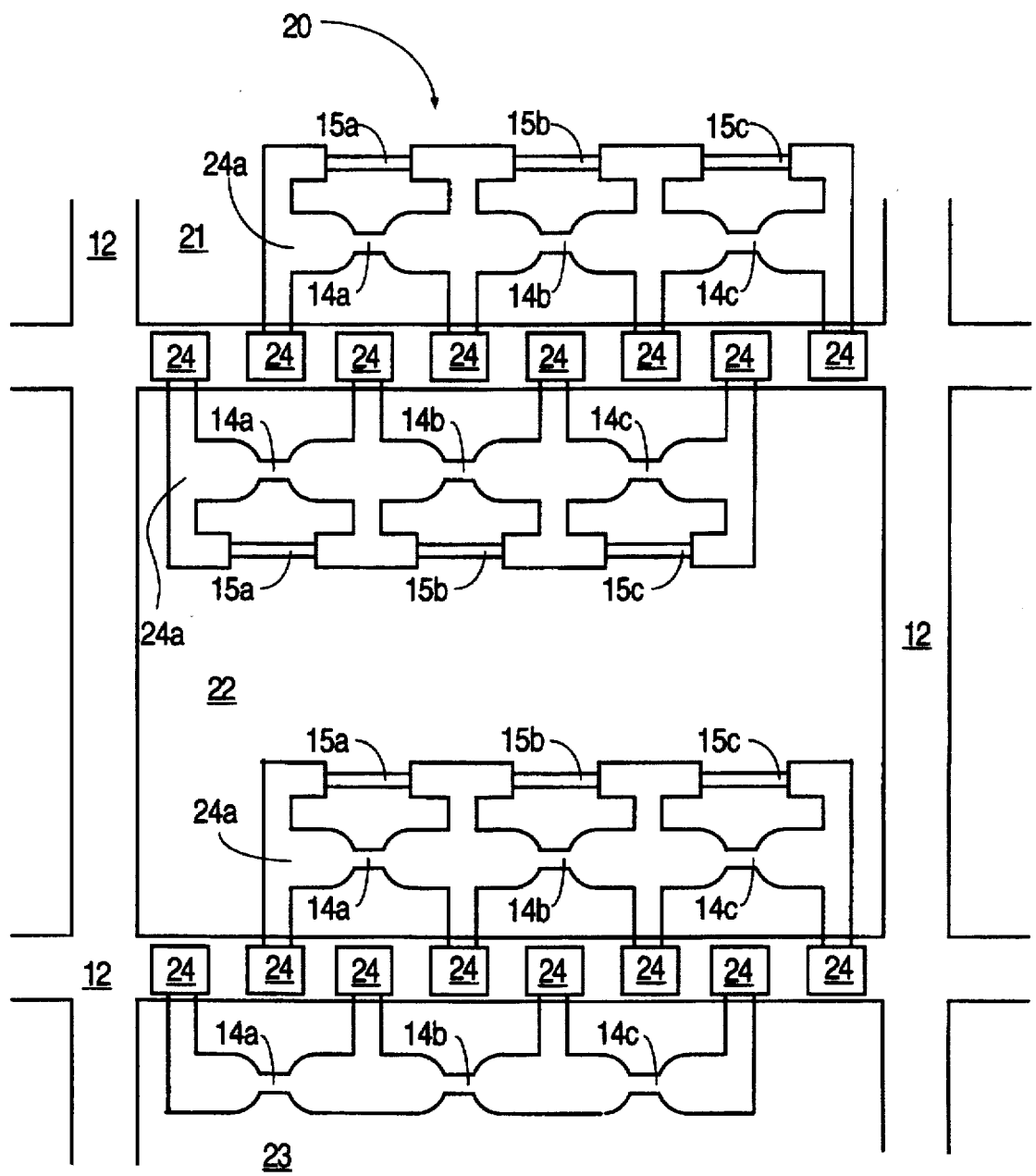
FIG. 2 shows dice having fusible links shunting associated resistive elements and having trim pads associated therewith configured in accordance with the present invention.

FIG. 2 shows a portion of a wafer 20 having formed thereon dice 21–23. Scribe channels 12 separate dice 21–23 from each other and are approximately 3 to 4 mils wide. Dice 21–23 are shown to have trimmable resistive elements 15a–15c formed thereon, each of which being shunted by a respective one of fusible links 14a–14c, acting as resistance control elements. Trim pads 24 which may be used as described earlier in trimming the resistance of associated resistive elements 15a–15c or in any other suitable manner, such as in testing procedures, are formed in scribe channels 12.

In the preferred embodiment, trim pads 24 have a surface area of approximately 3 mil×3 mil and are formed of metal. Resistive elements 15a–15c are shunted by respective ones of fusible links 14a–14c and connected to trim pads 24 via metal traces 24a, as shown in FIG. 2. Since scribe channels 12 are preferably only slightly wider than trim pads 24, a single row of trim pads 24 may be formed within each scribe channel 12, where alternating ones of trim pads 24 are associated with a particular resistive element 14, as illustrated in FIG. 2.

Trim pads 24 are preferably formed within scribe channels 12 during deposition of the first or second metal layer (not shown) in the formation of dice 21–23 according to any suitable metal deposition process. After being patterned and etched, trim pads 24 are covered with a protective insulating layer. Openings are then formed in the insulating layer over trim pads 24, as well as over any bond pads (not shown) in dice 21–23, to allow probes to make contact with trim pads 24. After used to trim resistive elements 15a–15c to a desired resistance value by conventional methods, trim pads 24 are then removed using well known techniques. A protective insulating layer (not shown) may be deposited on and around scribe channels 12 in order cover circuit metal 24a during removal of trim pads 24.

Forming trim pads 24 in scribe channels 12 results in a significant savings in valuable silicon area, thereby effectively increasing the usable portion of each die formed on wafer 20, while still allowing for the resistive elements 15a–15c formed within each of dice 21–23 to be independently trimmed. That is, for each trim pad 24 formed in scribe channel 12, there is a corresponding increase in the usable surface area of wafer 20. Unlike laser trimming techniques, the present invention achieves such increases in usable silicon real estate without requiring any additional equipment or skilled technicians, thereby minimizing production costs.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. Specifically, while described above in the context of metal fuse resistors, the present invention is equally applicable to poly fuse and zener trim techniques.

What is claimed is:

1. A resistive structure, having a resistance value, formed on a plurality of dice in a semiconductor wafer, said wafer having scribe channels interposed between said dice, said scribe channels identifying locations on said wafer where said wafer is to he sawed to separate said dice from one another, said resistive structure comprising:

one or more resistive elements formed on said dice;

a plurality of resistance control elements; and a plurality of trim pads, said one or more resistive elements being shunted by respective ones of said resistance control elements and connected between respective pairs of said trim pads, wherein said trim pads are formed in said scribe channels, said resistive structure being formed such that a current above a predetermined level applied to a pair of said trim pads changes a resistance value of said resistive structure.

2. The structure of claim 1 wherein said resistance control elements comprise a plurality of fusible links, each connected in parallel with an associated one of said one or more resistive elements.

3. The structure of claim 1 wherein said one or more resistive elements comprise diffused resistive material.

4. The structure of claim 1 wherein said one or more resistive elements comprise a resistive film.

* * * * *